(12) United States Patent
Kuo et al.

(10) Patent No.: US 10,886,231 B2
(45) Date of Patent: Jan. 5, 2021

(54) METHOD OF FORMING RDLS AND STRUCTURE FORMED THEREOF

(71) Applicant: Taiwan Semiconductor Manufacturing Company, Ltd., Hsinchu (TW)

(72) Inventors: Hung-Jui Kuo, Hsinchu (TW); Yun Chen Hsieh, Baoshan Township (TW); Hui-Jung Tsai, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/157,391

(22) Filed: Oct. 11, 2018

(65) Prior Publication Data

US 2020/0006240 A1  Jan. 2, 2020

Related U.S. Application Data

(60) Provisional application No. 62/691,971, filed on Jun. 29, 2018.

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ... H01L 23/5389; H01L 21/4846–4857; H01L 24/18–25; H01L 2224/023–024; H01L 21/4853; H01L 21/4857; H01L 21/565; H01L 21/568; H01L 21/6835; H01L 23/3107; H01L 23/5383; H01L 23/5386; H01L 24/19; H01L 24/20;
(Continued)

(56) References Cited

U.S. PATENT DOCUMENTS

| | | | |
|---|---|---|---|
| 3,726,002 A * | 4/1973 | Greenstein | .......... H01L 21/4857 29/832 |
| 7,504,716 B2 * | 3/2009 | Abbott | ................ H01L 21/4828 257/678 |

(Continued)

FOREIGN PATENT DOCUMENTS

| | | |
|---|---|---|
| CN | 107068669 A | 8/2017 |
| DE | 102015106585 A1 | 3/2016 |
| TW | 201804557 A | 2/2018 |

*Primary Examiner* — Bac H Au
(74) *Attorney, Agent, or Firm* — Slater Matsil, LLP

(57) ABSTRACT

A method includes encapsulating a device die in an encapsulating material, planarizing the device die and the encapsulating material, and forming a first plurality of conductive features electrically coupling to the device die. The step of forming the first plurality of conductive features includes a deposition-and-etching process, which includes depositing a blanket copper-containing layer, forming a patterned photo resist over the blanket copper-containing layer, and etching the blanket copper-containing layer to transfer patterns of the patterned photo resist into the blanket copper-containing layer.

20 Claims, 17 Drawing Sheets

(51) Int. Cl.
*H01L 21/56* (2006.01)
*H01L 21/683* (2006.01)
*H01L 23/31* (2006.01)
*H01L 23/00* (2006.01)
*H01L 25/10* (2006.01)
*H01L 25/00* (2006.01)

(52) U.S. Cl.
CPC .......... *H01L 21/565* (2013.01); *H01L 21/568* (2013.01); *H01L 21/6835* (2013.01); *H01L 23/3107* (2013.01); *H01L 23/5383* (2013.01); *H01L 23/5386* (2013.01); *H01L 24/19* (2013.01); *H01L 24/20* (2013.01); *H01L 25/105* (2013.01); *H01L 25/50* (2013.01); *H01L 2221/68372* (2013.01); *H01L 2224/214* (2013.01); *H01L 2225/1035* (2013.01); *H01L 2225/1058* (2013.01)

(58) Field of Classification Search
CPC ............... H01L 25/105; H01L 25/50; H01L 2221/68372; H01L 2224/214; H01L 2225/1035; H01L 2225/1058; H01L 23/49816; H01L 2224/13101; H01L 24/16; H01L 24/13; H01L 24/83; H01L 2224/8385; H01L 2224/48091; H01L 24/48; H01L 2224/83101; H01L 2924/00014; H01L 24/24; H01L 24/82; H01L 25/0655; H01L 2224/16238; H01L 2224/0401; H01L 2224/04042; H01L 2224/73204; H01L 2224/32145; H01L 2924/18161; H01L 2224/81005; H01L 2225/0651; H01L 2225/06568; H01L 2224/48227; H01L 2224/73267; H01L 2224/32225; H01L 2224/92244; H01L 2224/04105; H01L 2224/12105; H01L 2224/24137; H01L 2221/68331; H01L 21/6836; H01L 2221/68345; H01L 2221/68359; H01L 23/3128; H01L 2924/15311; H01L 2924/181
See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,735,129 B2 * | 8/2017 | Chen ..................... H01L 24/19 |
| 9,984,960 B2 * | 5/2018 | Hwang ............. H01L 23/49805 |
| 10,032,735 B2 * | 7/2018 | Yu ....................... H01L 23/3128 |
| 10,147,692 B2 | 12/2018 | Chen et al. |
| 10,290,571 B2 * | 5/2019 | Yu ........................... H01L 24/29 |
| 10,354,988 B2 | 7/2019 | Jeng et al. |
| 10,475,718 B2 * | 11/2019 | Chen ..................... H01L 24/19 |
| 10,515,930 B2 * | 12/2019 | Hung ............... H01L 21/76885 |
| 10,541,213 B2 * | 1/2020 | Tsai ..................... H01L 25/105 |
| 2004/0256734 A1 | 12/2004 | Farnworth et al. |
| 2006/0191711 A1 * | 8/2006 | Cho .................... H01L 23/5389 |
| | | 174/260 |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2016/0218033 A1 * | 7/2016 | Joshi ................. H01L 21/32134 |
| 2016/0240498 A1 * | 8/2016 | Cai ........................ H01L 24/03 |
| 2018/0138126 A1 | 5/2018 | Chen et al. |

* cited by examiner

METHOD OF FORMING RDLS AND STRUCTURE FORMED THEREOF

PRIORITY CLAIM AND CROSS-REFERENCE

This application claims the benefit of the following provisionally filed U.S. patent application: application Ser. No. 62/691,971, filed Jun. 29, 2018, and entitled "Method of Forming RDLs and Structure of forming Thereof," which application is hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

In a fan-out package, device dies are encapsulated in a molding compound, which is then planarized to expose the device die. Dielectric layers are formed over the device dies. Redistribution lines are formed in the dielectric layers to connect to the device die. The fan-out package may also include through-vias penetrating through the molding compound. The formation of redistribution lines includes forming a seed layer, forming a patterned photo resist, and plating the redistribution lines into the openings in the patterned resist.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
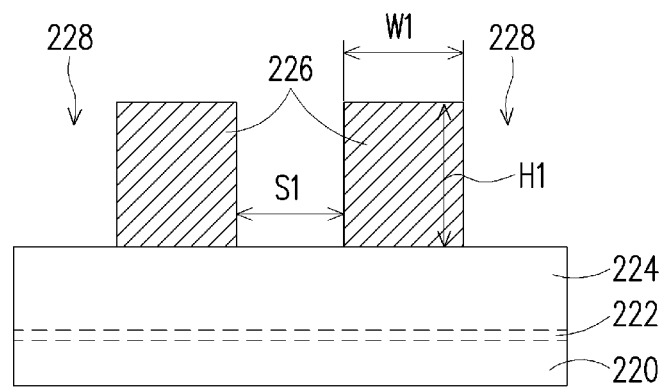
FIGS. 1 through 3 illustrate the cross-sectional views of intermediate stages in the formation of conductive features using a PR-etching process in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An Integrated Fan-Out (InFO) package and the method of forming the same are provided in accordance with various exemplary embodiments. The intermediate stages of forming the InFO package are illustrated in accordance with some embodiments. Some variations of some embodiments are discussed. Throughout the various views and illustrative embodiments, like reference numbers are used to designate like elements.

Figure 2:
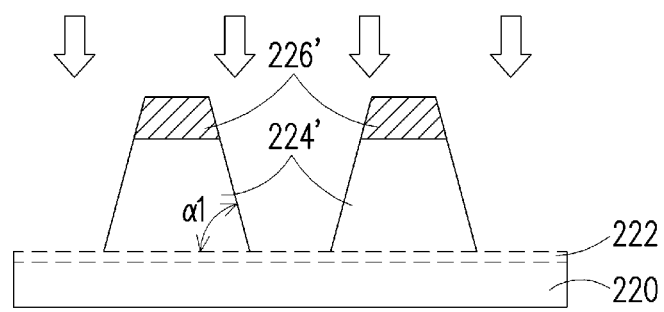
Figure 3:
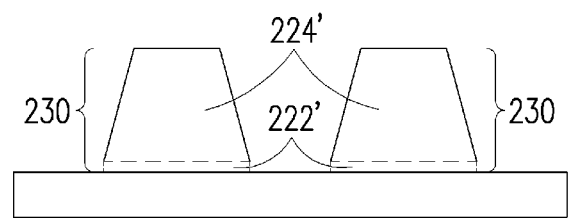

FIGS. 1 through 12 illustrate a plurality of candidate processes that may be used for forming conductive features (such as Redistribution Lines (RDLs, which include metal lines and vias) and metal pads) in packages. FIGS. 1 through 3 illustrate a first formation process (also referred to as a PR-etching process, with the term "PR" representing "photo resist"). FIGS. 4 through 8 illustrate a second formation process (also referred to as an HM-etching process, with the term "HM" representing "hard mask"). FIGS. 9 through 12 illustrate a third formation process (also referred to as PR-assisted plating process). Furthermore, the PR-etching process and the HM-etching process are individually and collectively referred to as deposition-and-etching processes. It is appreciated that in the formation of the conductive features in a package, depending on the requirements, the materials and the structures, different processes may be used to form different layers of conductive features in the same package, in order to achieve optimized result such as improve reliability without unnecessarily increase manufacturing cost.

FIGS. 1 through 3 illustrate the formation of conductive features using the PR-etching process in accordance with some embodiments of the present disclosure. This process may be used for forming fine-pitch conductive features. It is appreciated that the term "fine-pitch" is a term relative to "large-pitch," and the pitch difference between the fine-pitch conductive features and large-pitch conductive features is related to the specific process, the structure, and the materials of the structure. Furthermore, the threshold pitch between the "fine pitch" and "large pitch" may be affected by the photo resist used in the formation process. In accordance with some embodiments of the present disclosure, the threshold pitch, which divides the fine pitch and the large pitch, is in the range between about 0.1 μm and about 4 μm. For example, the threshold pitch may be about 4 μm.

Referring to FIG. 1, base structure 220 is formed. Base structure 220 represents any structure over which conductive features are to be formed, and the details of base structure 220 are not illustrated. Base structure 220 may include conductive features and dielectric layers, which may be parts of RDLs, device dies, packages, or the like. In accordance with some embodiments of the present disclosure, base structure 220 may represent any of the structures shown in FIGS. 21, 23, 24, and 27 and the intermediate structures in FIG. 33. In accordance with some embodiments of the present disclosure, base structure 220 has a planar top surface. In accordance with alternative embodiments of the present disclosure, base structure 220 has a non-planar top surface.

In accordance with some embodiments of the present disclosure, adhesion layer 222 is formed over base structure 220. In accordance with other embodiments of the present disclosure, adhesion layer 222 is omitted. Accordingly, layer 222 is illustrated as being dashed in FIG. 1. Adhesion layer 222 may include a metal different from copper, and may be formed of titanium, tantalum, titanium nitride, tantalum nitride, or the like. Adhesion layer 222 may be formed as a blanket layer, and may be deposited using Physical Vapor Deposition (PVD), Chemical Vapor Deposition (CVD), Plasma-Enhanced Chemical Vapor Deposition (PECVD), or the like. Blanket metal layer 224 is formed over base structure 220 and over adhesion layer 222 (if formed). Metal layer 224 may be formed of substantially pure copper or a copper alloy, and hence is alternative referred to as copper-containing layer 224, while metal layer 224 may be formed of other materials such as aluminum, nickel, or the like. Patterned photo resist 226 is formed over adhesion layer 222, and openings 228 are formed in the patterned photo resist 226, for example, through light-exposure and development.

In accordance with some embodiments, patterned photo resist 226 includes some portions having the shape of long strips in the top view. Patterned photo resist 226 may have aspect ratio H1/W1 smaller than about 1.5, and the aspect ratio may be in the range between about 1.0 and about 1.5 in accordance with some exemplary embodiments. The width W1 of portions of photo resist 226 may be in the range between about 0.3 μm and about 2 μm in accordance with some embodiments. Spacing S1 between neighboring portions of photo resist 226 may be in the range between about 0.3 μm and about 2 μm. Height H1 may be in the range between about 0.45 μm and about 3 μm. With a low aspect ratio, photo resist 226, especially those portions that are narrow, will not adversely collapse.

Referring to FIG. 2, a dry etching (represented by arrows) process is performed to etch copper-containing layer 224, and the remaining portions of copper-containing layer 224 are referred to as metal regions 224'. The etching may be performed using process gases including, and not limited to, argon, nitrogen, a fluorine-based gas, or combinations thereof. In the etching, photo resist 226 is also etched/consumed. Assuming the etching rate of photo resist 226 is R226, and the etching rate of copper-containing layer 224 is R224, the etching selectivity, which is R224/R226, may be adjusted. The adjustment of the etching selectivity may be through adjusting the composition of the process gases, the composition of photo resist 226, and/or the etching process conditions. The adjustment of the etching selectivity results in the sidewalls of metal regions 224' to be tilted, and metal regions 224' have trapezoid-shaped cross-sectional views, with bottom sides being longer than the respective top sides. For example, tilting angle α1 may be adjusted to desirable values, which may be smaller than about 85 degrees or smaller than about 80 degrees. Tilting angle α1 may be in the range between about 60 degrees and about 85 degrees, and may be in the range between about 65 and 80 degrees. Having the conductive features with bottom sides longer than top sides is advantageous for the adhesion of the conductive features with surrounding dielectric layers. For example, with the bottom sides to be longer than the top sides, the remaining portions of adhesion layer (FIG. 3) have greater areas than if the bottom sides are equal to or smaller than the respective top sides, and hence the adhesion of metal regions 224' to base structure 220 is improved. Furthermore, having the bottom sides longer than the respective top sides can also improve the adhesion of metal regions 224' to the dielectric layer that will be disposed at the same level as metal regions 224'.

After the etching of copper-containing layer 224, adhesion layer 222 is exposed, and is then etched. Photo resist 226 is also removed, either before or after the etching of adhesion layer 222. Adhesion layer 222 may be etched through wet etch or dry etch. The etching chemical/solution is selected to attack adhesion layer 222, and does not attack metal regions 224'. The etching chemical/solution may include the solution of HF, a mixture of $HF/H_2O_2$, $H_2O_2$ (with some other additives), $NaHCO_3$, NaOH, a mixture of $NaHCO_3/H_2O_2$, a mixture of $NaHCO_3/NaOH/H_2O_2$, or an alkali metal hydroxide aqueous solution. The alkali metal hydroxide aqueous solution may be the solution of NaOH, KOH, or the like. The remaining portions of adhesion layer 222 are denoted as adhesion layers 222', as shown in FIG. 3. Adhesion layers 222' and metal regions 224' are in combination referred to as conductive features 230.

Figure 4:
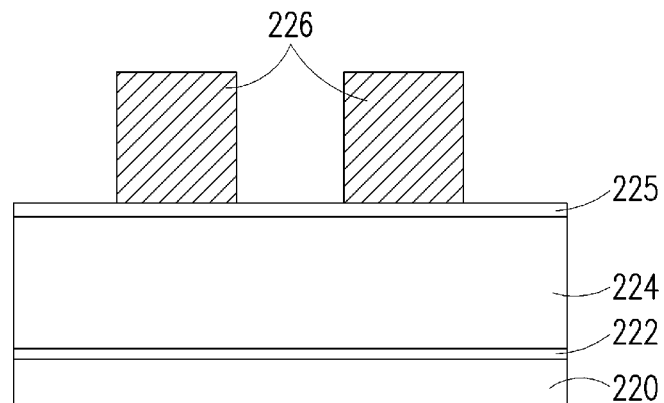
FIGS. 4 through 8 illustrate the cross-sectional views of intermediate stages in the formation of conductive features using an HM-etching process in accordance with some embodiments.
Figure 5:
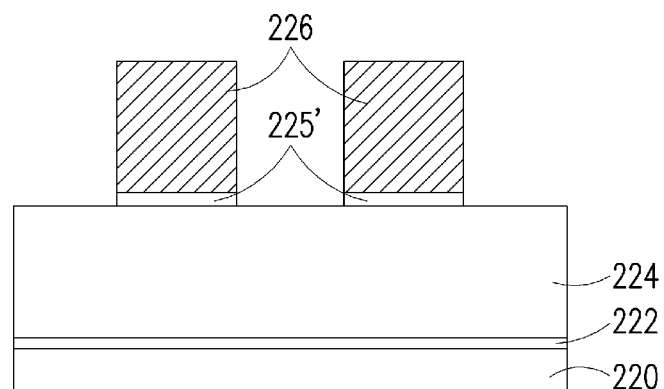
Figure 6:
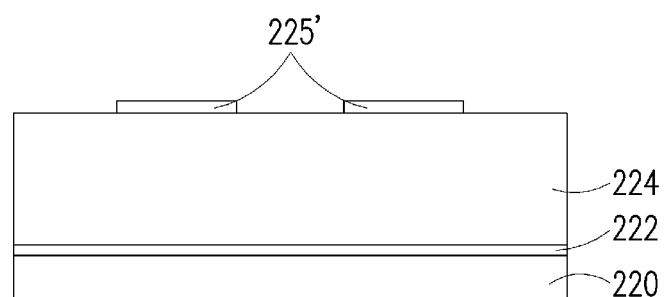

FIGS. 4 through 6 illustrate a process for forming conductive features 230 having vertical or substantially vertical sidewalls, for example, with tilting angle α2 (FIG. 7) greater than about 80 degrees and equal to or smaller than 90 degrees. Referring to FIG. 4, base structure 220 is formed, followed by the deposition of adhesion layer 222, blanket metal layer (also referred to as a copper-containing layer) 224, and the patterned photo resist 226. In addition, hard mask 225 is formed over copper-containing layer 224. In accordance with some embodiments of the present disclosure, hard mask 225 is formed of a material same as the material of adhesion layer 222, so that the process for forming hard mask 225 may be performed in the same production tool as adhesion layer 222, with no vacuum break therebetween. The production cost may thus be reduced. The exemplary dimensions and the spacing of photo resist 226 may be similar to what are discussed referring to FIG. 1, and are not repeated herein. The aspect ratio of photo resist 226 is low, for example, in the range between about 1.0 and about 1.5, so that it does not suffer from collapsing.

Figure 7:
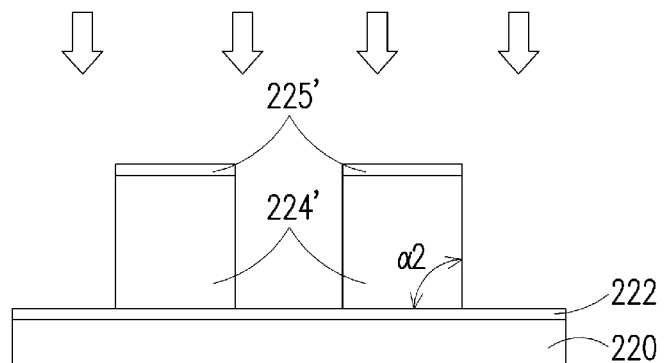
Figure 8:
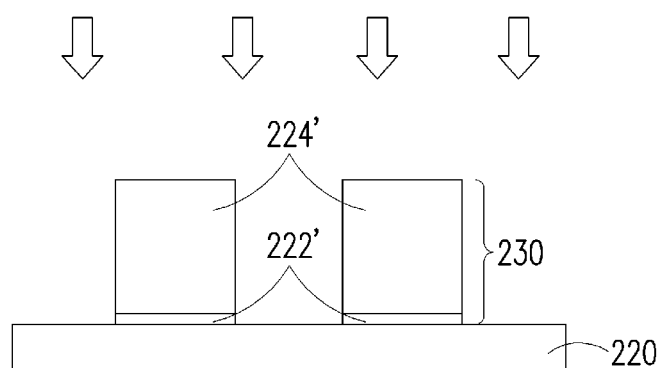

Hard mask 225 is then etched, with the remaining portions denoted as 225' as shown in FIG. 5. The etching may be performed through dry etching or wet etching. After the etching of hard mask 225, photo resist 226 is removed, and the resulting structure is shown in FIG. 6. Next, hard mask 225' is used as an etching mask to etch the underlying copper-containing layer 224, and the remaining portions of copper-containing layer 224 are illustrated as metal regions 224', as shown in FIG. 7. The etching is anisotropic, and may be performed through dry etching. The etching gases may include, and are not limited to, oxygen, a fluoride(s) such as hydrofluoric acid, a chloride(s) such as ferric chloride, or combinations thereof. Argon and nitrogen may also be added. Unlike photo resist, which is consumed in the etching, hard mask 225' is not etched/consumed significantly. As a result, the sidewalls of the remaining portions of the resulting metal regions 224' are vertical or substantially vertical, for example, with tilting angle α2 being greater than 85 degrees, or about 88 degrees and lower than or equal to 90 degrees. Tilting angle α2 may also be greater than tilt angle α1 in FIG. 2, for example, with difference (α2-α1) being greater than about 2 or 3 degrees. Adhesion layer 222 is then etched using hard mask 225' and metal regions 224' as an etching mask. Hard mask 225' is removed after the removal of adhesion layer 222. The resulting structure is shown in FIG. 8. Remaining adhesion layers 222' and metal regions 224' are in combination referred to as conductive features 230.

Figure 9:
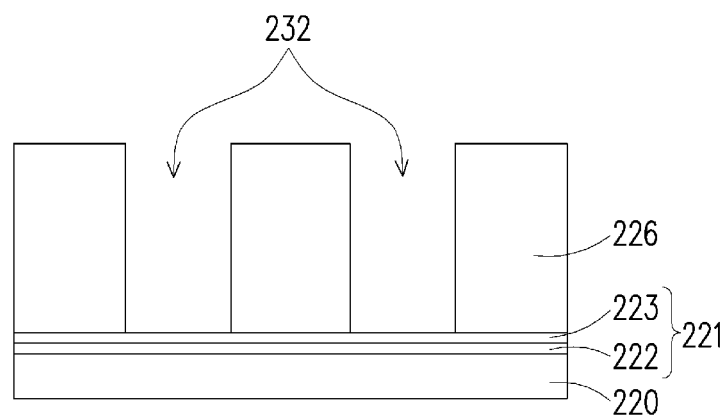
FIGS. 9 through 12 illustrate the cross-sectional views of intermediate stages in the formation of conductive features through a PR-assisted plating process in accordance with some embodiments.

FIGS. 9 through 12 illustrate the PR-assisted plating process. Referring to FIG. 9, metal seed layer 221 is formed on base structure 220. Metal seed layer 221 is formed as a blanket layer, which may include adhesion layer 222 and copper-containing layer 223. Copper-containing layer 223 may be formed of substantially pure copper or a copper alloy. Patterned photo resist 226 is formed over metal seed layer 221, and openings 232 are formed, for example, by light-exposing photo resist 226 using a photolithography mask, and then developing photo resist 226.

Figure 10:
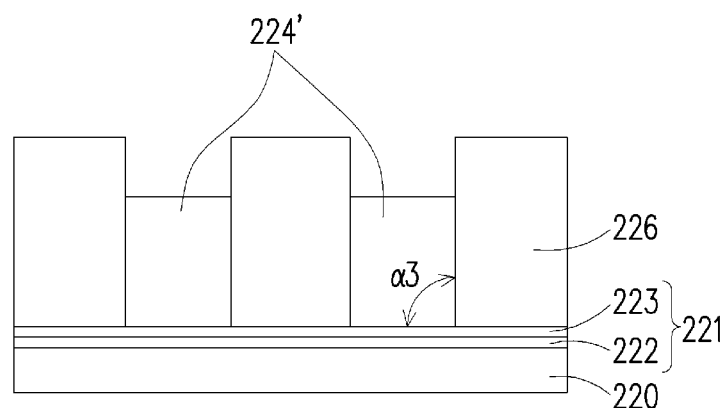

Next, referring to FIG. 10, metal regions 224' are formed, for example, by plating a metallic material into openings 232. The plated metallic material may be copper or a copper alloy. The top surfaces of metal regions 224' are lower than the top surface of photo resist 226, so that metal regions 224' are confined by openings 228. Metal regions 224' may have substantially vertical sidewalls. For example, tilt angle α3 may be slightly smaller than, equal to, or slightly greater than 90, degrees (between 85 degrees and about 90 degrees or between about 90 degrees and about 100 degrees, for example).

Figure 11:
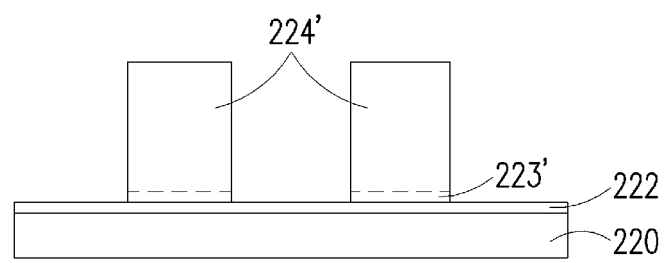
Figure 12:
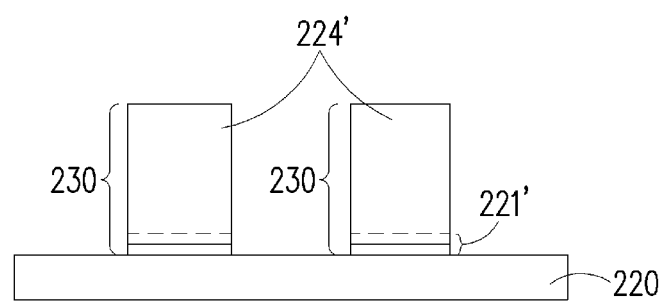

In a subsequent step, the patterned photo resist 226 is removed, and hence the underlying portions of metal seed layer 221 are exposed. The exposed portions of metal seed layer 221 are then removed in a plurality of etching step(s), for example, anisotropic etching steps, isotropic etching steps, or combinations thereof, as shown in FIGS. 11 and 12. Throughout the description, the remaining portions of metal seed layer 221' and metal regions 224' are in combination referred to as conductive features 230.

Each of the three processes as illustrated in FIGS. 1 through 12 has its advantageous and disadvantageous features. For example, the PR-etching process (FIGS. 1 through 3) and the HM-etching process (FIGS. 4 through 6) are suitable for forming fine-pitch conductive features since the aspect ratio of the photo resists (FIGS. 1 and 3) can be adjusted to be adequately low to avoid photo resist collapsing problem. The process difficulty of the processes shown in FIGS. 1 through 3 and FIGS. 4 through 8, however, is high, and manufacturing cost is relatively high. For example, copper is difficult to be etched.

Figure 13:
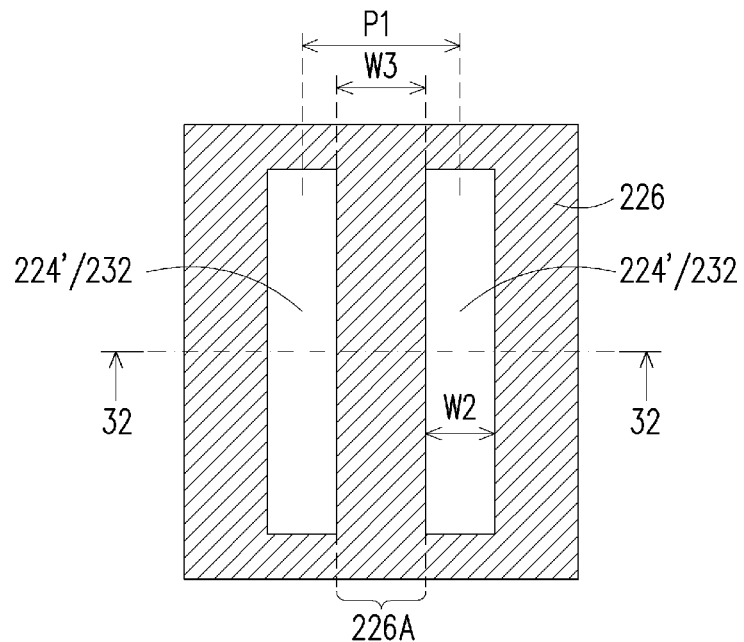
FIGS. 13 and 14 illustrate a top view and a cross-sectional view, respectively, of a photo resist used for forming elongated conductive lines using a PR-assisted plating process in accordance with some embodiments.
Figure 14:
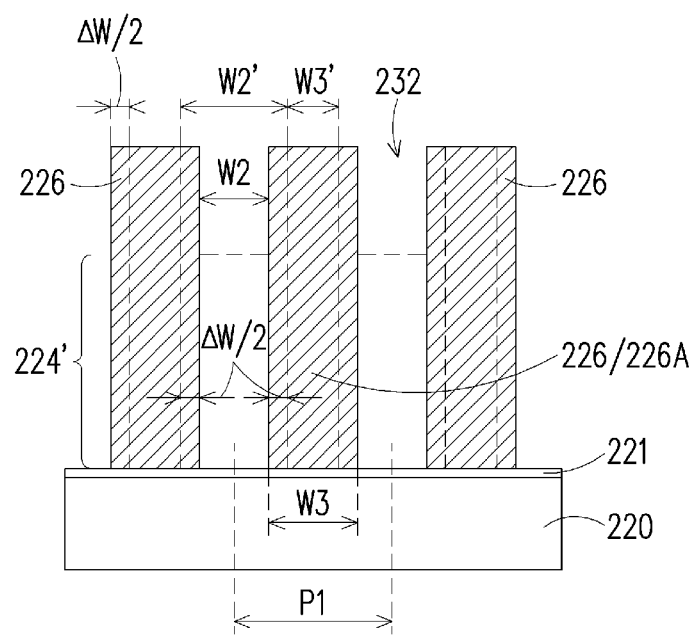

On the other hand, the PR-assisted etching process is not suitable for forming fine-pitch conductive features due to reliability problem. For example, FIGS. 13 and 14 are illustrated to show a top view and a cross-sectional view, respectively, of photo resist 226 and the plated metal regions 224' in openings 232. As shown in FIG. 13, openings 232 are to be formed in photo resist 226. Openings 232 have elongated shapes, with pitch P1 being small. The middle portion 226A of photo resist 226 between two neighboring openings 232 is narrow, with the desirable width W3. Openings 232 have desirable width W2.

FIG. 14 illustrates a cross-sectional view of the structure shown in FIG. 13, with the cross-sectional view being obtained from the plane crossing line 32-32 in FIG. 13. Metal regions 224' are to be formed in openings 232, with metal regions 224' having desirable width W2. After the plating of metal regions 224', photo resist 226 is removed, and the underlying metal seed layer 221 is etched. In the etching of metal seed layer 221, since the metal seed layer 221 includes a portion formed of the same or similar material as metal regions 224' (copper), metal regions 224' will also be etched, and the width of the resulting metal regions 224' will be reduced by difference ΔW. To compensate for this undesirable reduction in the width of metal regions 224', openings 232 as shown in FIG. 14 need to have width W2', which is equal to (W2+ΔW). Since the pitch P1 of metal regions 224' cannot be reduced, the width W3 of photo resist portion 226A will be reduced from W3 to W3', which is equal to (W3−W3'). The thickness of photo resist 226, on the other hand, cannot be reduced accordingly since the thickness of photo resist 226 needs to be greater than the designed thickness of than metal regions 224'. The aspect ratio of middle portion 226A of photo resist 226 is thus further increased. For example, to a value greater than about 4 or 5. As also shown in FIG. 13, photo resist portion 226A is a long strip, which suffers from collapsing.

Figure 15:
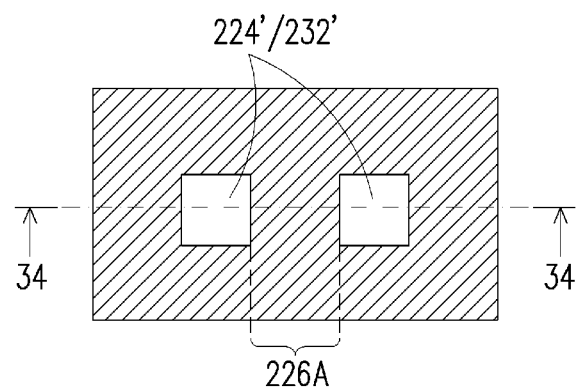
FIGS. 15 and 16 illustrate a top view and a cross-sectional view, respectively, of a photo resist used for forming vias using a PR-assisted plating process in accordance with some embodiments.
Figure 16:
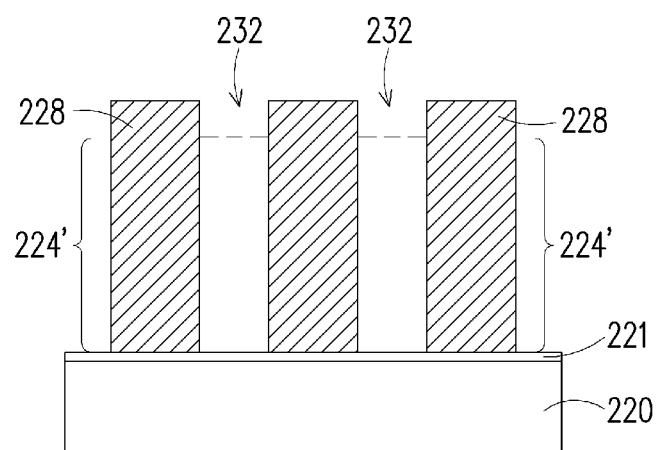

FIGS. 15 and 16 illustrate the top view and the cross-sectional view of the patterns for forming vias of metal regions 224', which will be plated in openings 232. The cross-sectional view shown in FIG. 16 is obtained from the plane crossing line 34-34 in FIG. 15. From FIGS. 15 and 16, it is observed that the formation of the vias may suffer from similar problems as shown in FIGS. 13 and 14. It is also observed from FIG. 33 that since the middle photo resist portion 226A between two neighboring openings 232 is not as elongated as shown in FIG. 13, the photo resist collapsing problem is less severe as in FIGS. 13 and 14 when fine-pitch vias are formed.

For the advantageous features and disadvantageous features of the processes shown in FIGS. 1 through 12, in the formation of the conductive features such as RDLs (metal lines and vias) and metal pads, different processes may be used to form different layers in order to take advantage of the advantageous features while avoiding the disadvantageous features. For example, when forming fine-pitch conductive features, the PR-etching process or the HM-etching process may be used to avoid reliability problem. When forming large-pitch conductive features (which may be in the same package as the fine-pitch conductive features) in which the reliability problem associated with the collapsing of photo resist does not exist, the PR-assisted plating process may be adopted to take advantageous features of the lower process difficulty and lower manufacturing cost.

The threshold pitch that divides fine-pitch and large-pitch conductive features is related to the material, the structure, and the process for forming the conductive features, and may be determined through experiments on sample wafers. For example, a plurality of sample wafers may be formed having different types of conductive features (RDLs, metal lines, vias, metal pads, etc.) and using different formation processes. The threshold pitch may be determined as the minimum pitch that can be achieved using the PR-assisted plating process without causing reliability problem (such as PR collapsing). Accordingly, fine-pitches are smaller than the threshold pitch, and large-pitches are equal to or greater than the threshold pitch. Also, since each of layers of the conductive features may have a plurality of different pitches, when determining whether the pitch of a layer of conductive features is greater than, equal to, or smaller than, the threshold pitch, the minimum pitch (smallest pitch) of the respective layer of conductive features is used to compare with the threshold pitch.

Figure 35:
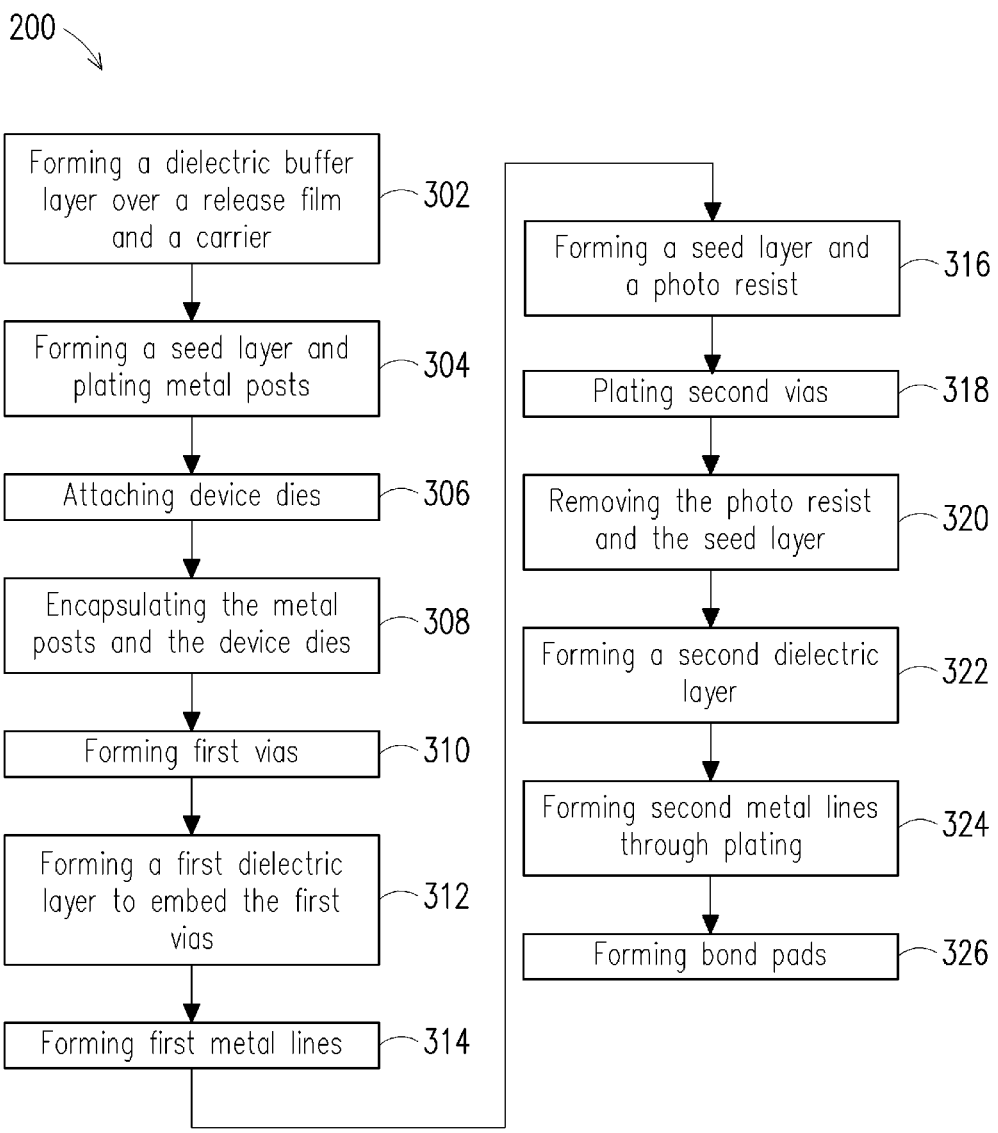
FIG. 35 illustrates a process flow for forming packages in accordance with some embodiments.

FIGS. 17 through 32 illustrate the cross-sectional views of intermediate stages in the formation of a package in accordance with some embodiments. The steps shown in FIG. 17 through 32 are also illustrated schematically in the process flow 300 shown in FIG. 35.

Figure 17:
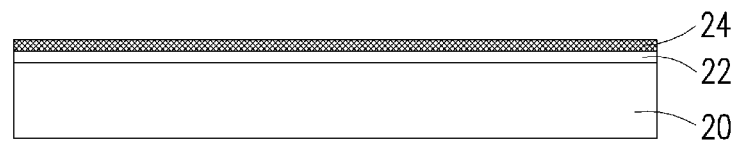
FIGS. 17 through 32 illustrate the cross-sectional views of intermediate stages in the formation of a package using Redistribution-Line (RDL) last process in accordance with some embodiments.

Referring to FIG. 17, carrier 20 is provided, and release film 22 is coated on carrier 20. The respective process is illustrated as process 302 in the process flow shown in FIG. 35. Carrier 20 is formed of a transparent material, and may be a glass carrier, a ceramic carrier, an organic carrier, or the like. Carrier 20 may have a round top-view shape. Release film 22 is in physical contact with the top surface of carrier 20. Release film 22 may be formed of a Light-To-Heat-Conversion (LTHC) coating material, and may be applied onto carrier 20 through coating. In accordance with some embodiments of the present disclosure, the LTHC coating material is capable of being decomposed under the heat of light/radiation (such as laser), and hence can release carrier 20 from the structure formed thereon. Release film 22 is alternatively referred to as LTHC coating material 22.

In accordance with some embodiments of the present disclosure, as shown in FIG. 17, dielectric buffer layer 24 is formed on LTHC coating material 22. The respective process is also illustrated as process 302 in the process flow shown in FIG. 35. In accordance with some embodiments, dielectric buffer layer 24 is formed of a polymer such as polybenzoxazole (PBO), polyimide, benzocyclobutene (BCB), or the like.

Figure 18:
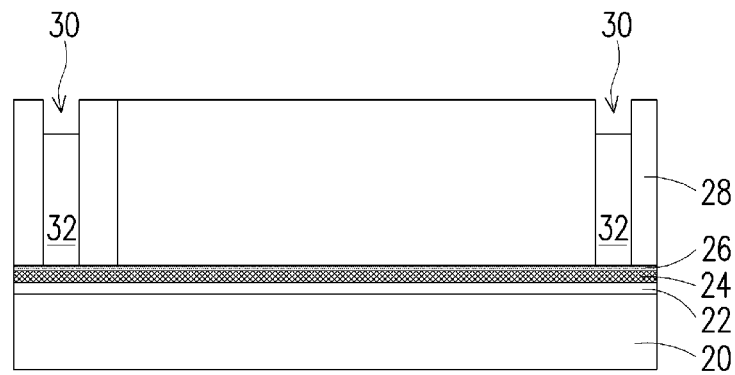
Figure 19:
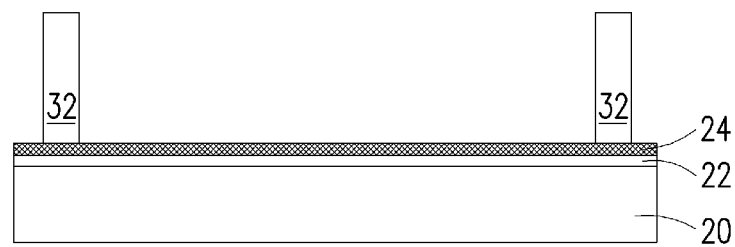

FIGS. 18 and 19 illustrate the formation of metal posts 32. Referring to FIG. 18, metal seed layer 26 is formed, for example, through Physical Vapor Deposition (PVD). The respective process is illustrated as process 304 in the process flow shown in FIG. 35. In accordance with some embodiments of the present disclosure, metal seed layer 26 includes a titanium layer and a copper layer over the titanium layer. Photo resist 28 is formed over metal seed layer 26. A light-exposure is then performed on photo resist 28 using a photo lithography mask (not shown). After a subsequent development, openings 30 are formed in photo resist 28. Some portions of metal seed layer 26 are exposed through openings 30.

Next, metal posts 32 are formed, for example, by plating a metallic material in openings 30. The respective process is also illustrated as process 304 in the process flow shown in FIG. 35. Metal posts 32 are alternatively referred to as through-vias or through-molding vias since they will penetrate through the subsequently formed encapsulating material (which may be a molding compound) in the final package. The plated metallic material may be copper or a copper alloy. The top surfaces of metal posts 32 are lower than the top surface of photo resist 28, so that the shapes of metal posts 32 are confined by openings 30. Metal posts 32 may have substantially vertical and straight edges. Alternatively, metal posts 32 may have a sand timer shape in a cross-sectional view, with the middle parts of metal posts 32 being narrower than the respective top parts and bottom parts.

In a subsequent step, the patterned photo resist 28 is removed, and hence the underlying portions of metal seed layer 26 are exposed. The exposed portions of metal seed layer 26 are then removed in etching steps, for example, in anisotropic etching steps or isotropic etching steps. The edges of the remaining metal seed layer 26 may thus be co-terminus or substantially co-terminus with the respective overlying portions of metal posts 32, or may be laterally recessed from the respective edges of the respective overlying plated material, hence having undercuts. The resulting metal posts 32 are illustrated in FIG. 19, in which undercuts are not shown. Throughout the description, the remaining portions of metal seed layer 26 (FIG. 19) are considered as parts of metal posts 32. The top-view shapes of metal posts 32 include, and are not limited to, circular shapes, rectangles, hexagons, octagons, and the like. After the formation of metal posts 32, dielectric buffer layer 24 is exposed.

Figure 20:
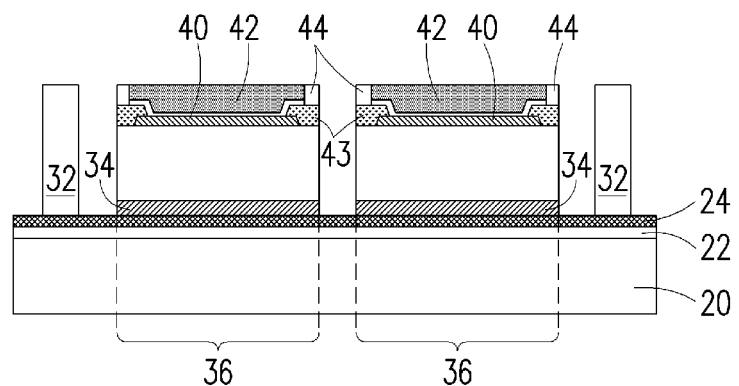

FIG. 20 illustrates the placement/attachment of devices 36 (alternatively referred to as package components). The respective process is illustrated as process 306 in the process flow shown in FIG. 35. Devices 36 may be device dies, and hence are referred to as device dies 36 hereinafter, while devices 36 may also be packages, die stacks, or the like. Device dies 36 are attached to dielectric buffer layer 24 through Die-Attach Films (DAFs) 34, which are adhesive films pre-attached on device dies 36 before device dies 36 are placed on dielectric buffer layer 24. Device dies 36 may include semiconductor substrates having back surfaces (the surface facing down) in contact with the respective underlying DAFs 34. Devices die 36 may include integrated circuit devices such as active devices, which include transistors (not shown) at the front surface (the surface facing up) of the semiconductor substrate. In accordance with some embodiments of the present disclosure, device dies 36 include one or more logic die, which may be a Central Processing Unit (CPU) die, a Graphic Processing Unit (GPU) die, a mobile application die, a Micro Control Unit (MCU) die, an input-output (IO) die, a BaseBand (BB) die, or an Application processor (AP) die. Since carrier 20 is a wafer-level carrier, although one device die 36 is illustrated, a plurality of identical groups of device dies 36 may be placed over dielectric buffer layer 24 in the die-placement step, and the device die groups may be allocated as an array including a plurality of rows and a plurality of columns.

In accordance with some exemplary embodiments, metal pillars 42 (such as copper pillars) are pre-formed as parts of device dies 36, and metal pillars 42 are electrically coupled to the integrated circuit devices such as transistors (not shown) in device die 36 through the underlying metal pads 40, which may be, for example, aluminum pads. Although one metal pad 40 and one metal pillar 42 are illustrated as in each of devices 36, each of devices 36 may include a plurality of metal pads 40 and a plurality of overlying metal pillars 42. In accordance with some embodiments of the present disclosure, a top dielectric layer (such as polymer layer) 44 fills the gaps between neighboring metal pillars 42 in the same device die to form a top dielectric layer. Top dielectric layer 44 is also referred to as polymer layer. Passivation layer 43 may also be underlying polymer layer 44. Top dielectric layer 44 may also include a portion covering and protecting metal pillars 42. Top dielectric layer 44, when formed of polymer, may be formed of PBO or polyimide in accordance with some embodiments of the present disclosure. It is appreciated that device dies 36 may have different designs including different top dielectric layers, which are contemplated by the embodiments of the present disclosure.

Figure 21:
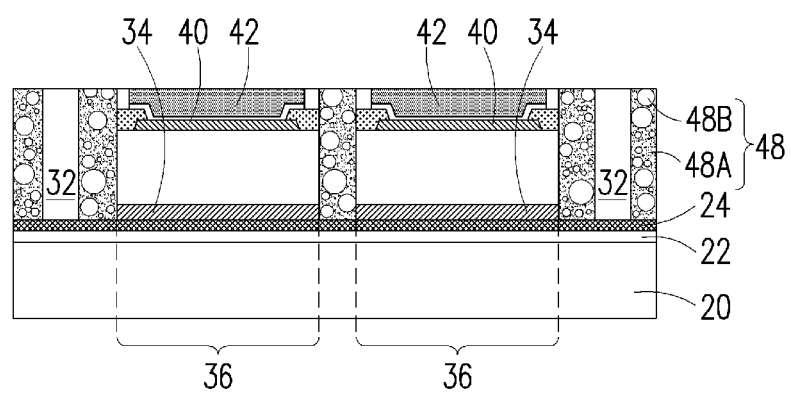

Next, referring to FIG. 21, device dies 36 and metal posts 32 are encapsulated in encapsulating material 48. The respective process is illustrated as process 308 in the process flow shown in FIG. 35. Accordingly, metal posts 32 are referred to as through-vias hereinafter. Encapsulating material 48 fills the gaps between through-vias 32 and device dies 36. Encapsulating material 48 may be a molding compound, a molding underfill, an epoxy, and/or a resin. The top surface of encapsulating material 48 is higher than the top ends of metal pillars 42 and through-vias 32. Encapsulating material 48 may include base material 48A, which may be a polymer, a resin, an epoxy, or the like, and filler particles 48B in the base material 48A. The filler particles may be particles of a dielectric material(s) such as $SiO_2$, $Al_2O_3$, silica, or the like, and may have spherical shapes. Also, the spherical filler particles 48B may have the same or different diameters, as illustrated in accordance with some examples.

In a subsequent step, as also shown in FIG. 21, a planarization process such as a Chemical Mechanical Polish (CMP) process or a mechanical grinding process is performed to thin encapsulating material 48 and dielectric layer 44, until through-vias 32 and metal pillars 42 are exposed. Through-vias 32 and metal pillars 42 may also be polished slightly to ensure the exposure of both through-vias 32 and metal pillars 42. Due to the planarization process, the top ends of through-vias 32 are substantially level (coplanar) with the top surfaces of metal pillars 42, and are substantially coplanar with the top surface of encapsulating material 48. Due to the planarization process, some filler particles 48B at the top of the molded encapsulating material 48 are polished partially, causing some of the filler particles to have their top portions removed, and bottom portions remaining, as shown in FIG. 21. The resulting partial filler particles will thus have top surfaces to be planar, which planar top surfaces are coplanar with the top surface of base material 48A, through-vias 32, and metal pillars 42.

Figure 22:
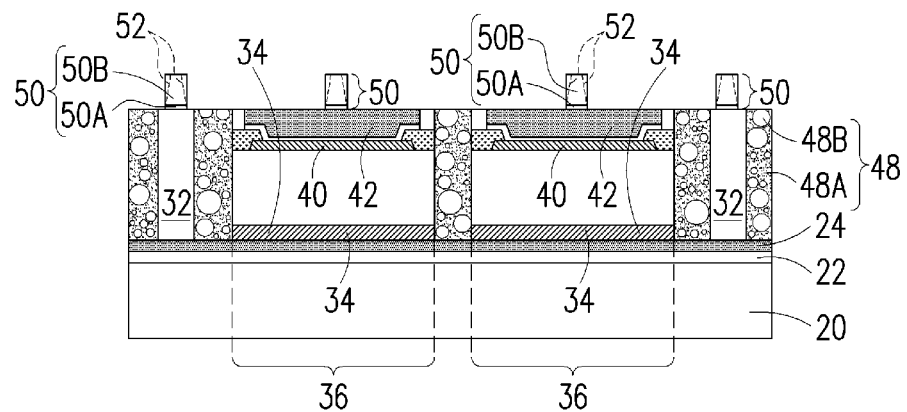

FIGS. 22 through 30 illustrate the formation of a front-side redistribution structure. In the process shown in FIGS. 22 through 30, the adhesion layers 50A correspond to the adhesion layers 222' in FIGS. 1 through 12, and the metal regions (such as 50B, 58B) overlying the corresponding adhesion layers (such as 50A, 58A) correspond to the metal regions 224' in FIGS. 1 through 12. Referring to FIG. 22, vias 50 are formed over and electrically connected to through-vias 32 and metal pillars 42. The respective process is illustrated as process 310 in the process flow shown in FIG. 35. Vias 50 may include adhesion layers 50A and metal regions 50B. The formation process may adopt a suitable process selected from the PR-etching process (FIGS. 1 through 3), the HM-etching process (FIGS. 4 through 8), and the PR-assisted plating process (FIGS. 9 through 12), depending on whether the pitches of vias 50 are fine pitches or large pitches. FIG. 22 illustrates dashed lines 52, which represent the sidewall of vias 50 when the PR-etching process is adopted to form vias 50. Alternatively, the sidewalls of vias 50 may be vertical or substantially vertical, which may be achieved when the HM-etching process or the PR-assisted plating process is adopted.

Figure 23:
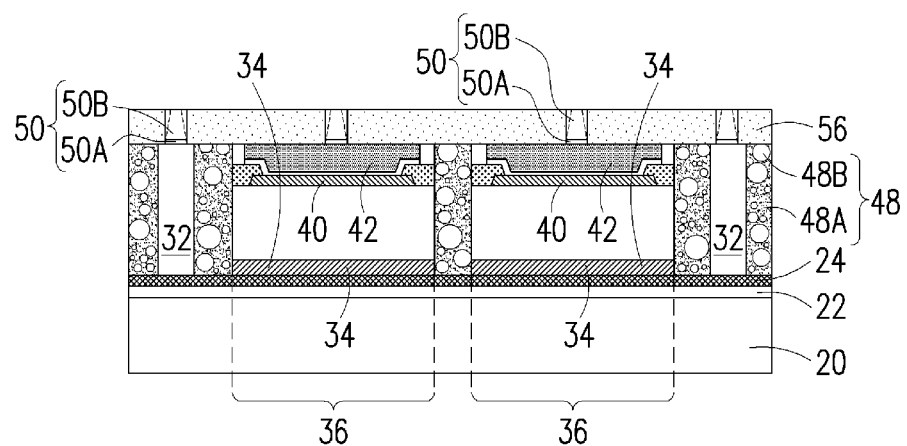

Referring to FIG. 23, dielectric layer 56 is formed. The respective process is illustrated as process 312 in the process flow shown in FIG. 35. In accordance with some embodiments of the present disclosure, dielectric layer 56 is formed of a polymer such as polybenzoxazole (PBO), polyimide, or the like. The formation method includes coating dielectric layer 56 in a flowable form, and then curing dielectric layer 56 using thermal curing or Ultra-Violet (UV) curing. In accordance with alternative embodiments of the present disclosure, dielectric layer 56 is formed of an inorganic dielectric material such as silicon nitride, silicon oxide, or the like. The formation method may include Chemical Vapor Deposition (CVD), Atomic Layer Deposition (ALD), PECVD, or other applicable deposition methods. A planarization process such as a CMP process or a mechanical grinding process is then applied to planarize the top surfaces of vias 50 and dielectric layer 56.

Figure 24:
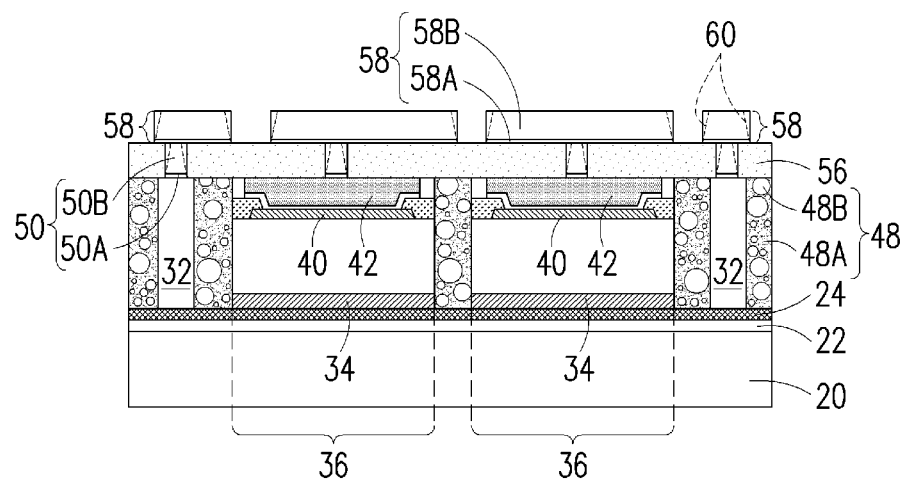

FIG. 24 illustrates the formation of metal lines 58 over and electrically connected to vias 50. Metal lines 58 may include adhesion layers 58A and metal regions 58B. The respective process is illustrated as process 314 in the process flow shown in FIG. 35. The formation process may adopt any of the suitable processes selected from the PR-etching process, the HM-etching process, and the PR-assisted plating process in accordance with various embodiments, depending on whether the pitches of metal lines 58 are fine-pitches or large-pitches. FIG. 24 illustrates dashed lines 60, which represent the sidewall of metal lines 58 when the PR-etching process is adopted. Alternatively, the sidewalls of metal lines 58 may be vertical or substantially vertical, which may be achieved when the HM-etching process or the PR-assisted plating process is used.

It is appreciated that metal lines 58 may include elongated metal lines parallel with each other, similar to what is shown in FIG. 13. Vias 50 are likely to have greater spacing and pitches. Accordingly, metal lines 58 are more likely to suffer from photo resist collapsing problem than vias 50. In accordance with some embodiments of the present disclosure, metal lines 58 are formed using the PR-etching process or the HM-etching process, while vias 50 are formed using the PR-assisted plating process. In accordance with alternative embodiments of the present disclosure, each of metal lines 58 and vias 50 is formed using the PR-etching process, and the HM-etching process.

Figure 25:
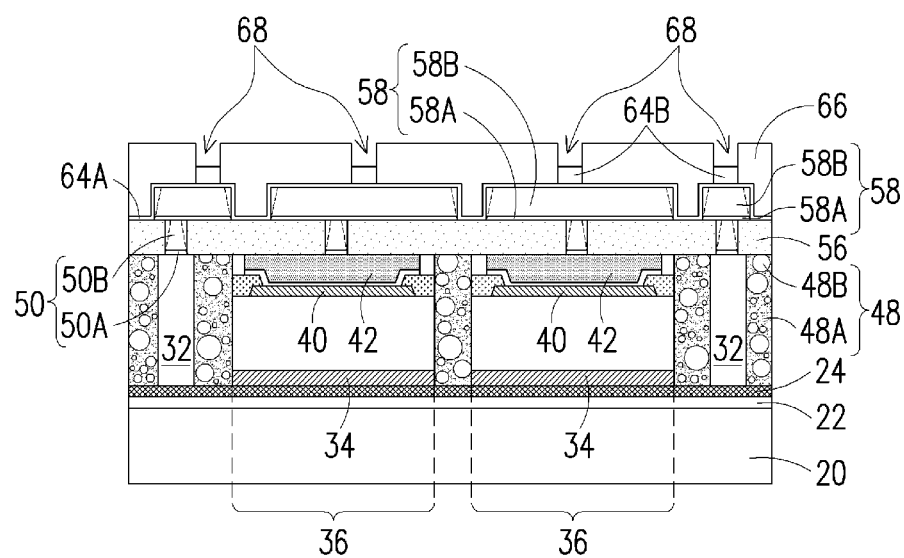
Figure 26:
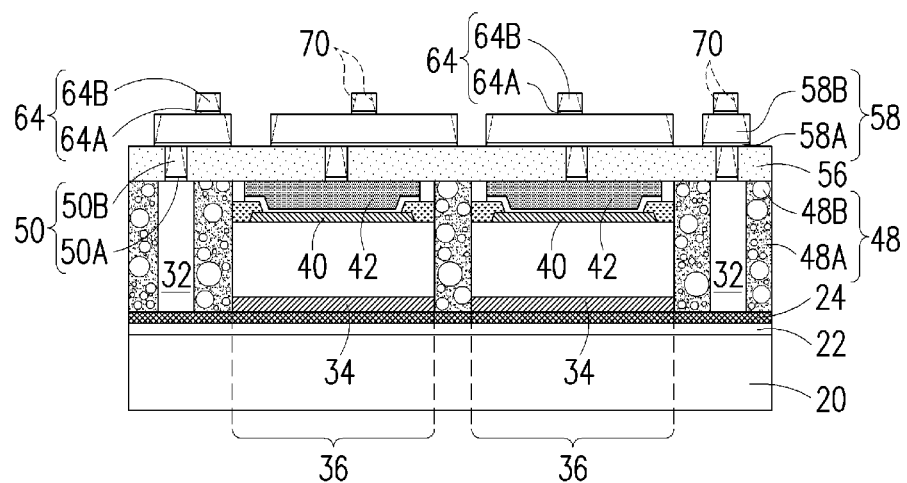

FIGS. 25 and 26 illustrate the cross-sectional views of intermediate stages in the formation of vias 64 (FIG. 26) using the PR-assisted plating process in accordance with some embodiments of the present disclosure. Referring to FIG. 25, metal seed layer 64A is formed. The respective process is illustrated as process 316 in the process flow shown in FIG. 35. The formation methods and the materials of metal seed layer 64A may be similar to the metal seed layer 221 shown in FIG. 9, and hence are not repeated herein. Patterned photo resist 66 is then formed, with openings 68 overlapping portions of metal lines 58. The respective process is also illustrated as process 316 in the process flow shown in FIG. 35. Next, metal regions 64B (which are vias) are formed in openings 68 through plating. The respective process is illustrated as process 318 in the process flow shown in FIG. 35. After the formation of metal regions 64B, photo resist 66 is removed. Next, the exposed portions of metal seed layer 64A are etched, and the remaining portions are also denoted as 64A, as shown in FIG. 26. The respective process is illustrated as process 320 in the process flow shown in FIG. 35. Metal regions 64B and the remaining portions of metal seed layer 64A are in combination referred to as vias 64 as shown in FIG. 26.

In accordance with alternative embodiments, vias 64 are formed using the PR-etching process or the HM-etching process. Dashed lines 70 represent the tilted sidewalls of vias 64 when they are formed using the PR-etching process. Similarly, whether vias 64 are formed using the PR-etching process or the HM-etching process is determined based on the reliability of the PR, and the preference whether sidewalls are to be tilted.

Figure 27:
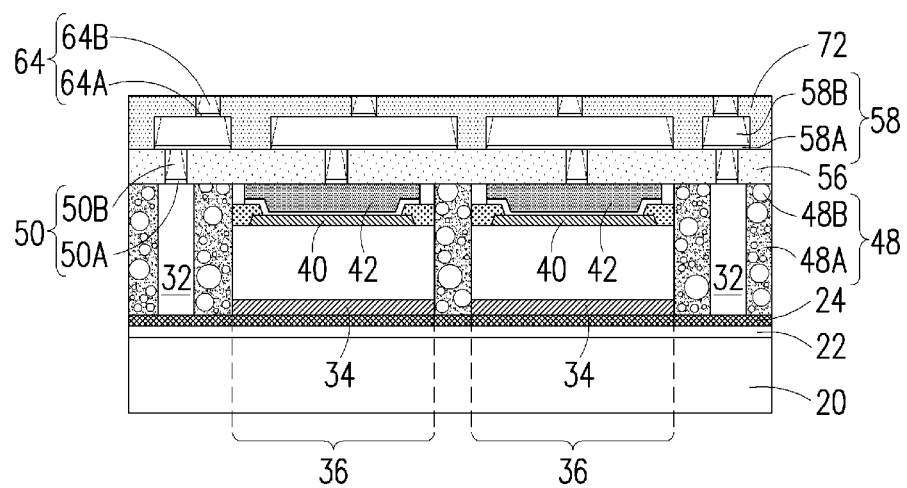

Referring to FIG. 27, dielectric layer 72 is formed. The respective process is illustrated as process 322 in the process flow shown in FIG. 35. The material and the formation method of dielectric layer 72 may be selected from the candidate materials and the candidate methods for forming dielectric layer 56. A planarization process such as a CMP process or a mechanical grinding process is then applied to planarize the top surfaces of vias 64 and dielectric layer 72. In accordance with alternative embodiments, instead of forming dielectric layer 72 after the formation of both metal lines 58 and vias 64, a first dielectric layer may be formed after the formation of metal lines 58 and before the formation of vias 64, followed by a first planarization process, and a second dielectric layer may be formed after the formation of vias 64, followed by a second planarization process.

Figure 28:
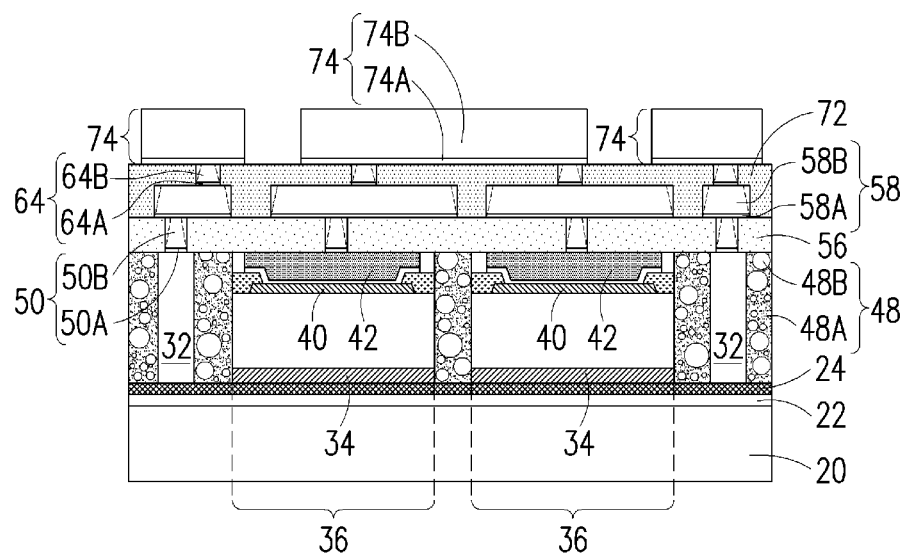
Figure 29:
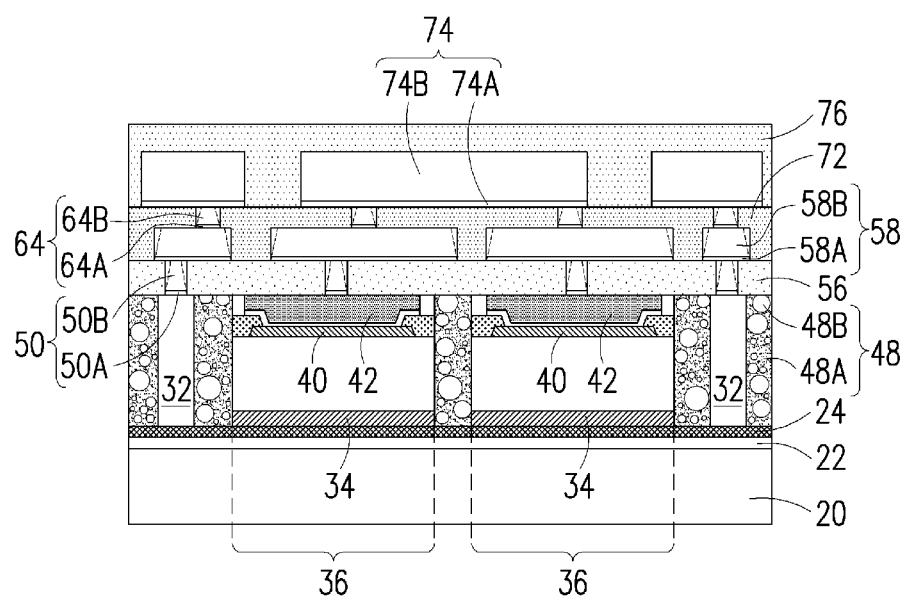
Figure 30:
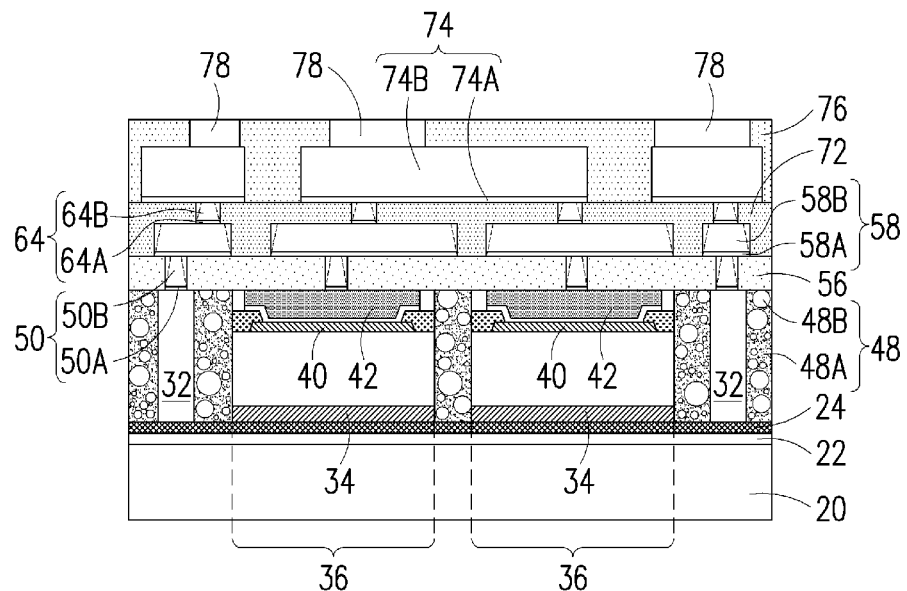

FIGS. 28 through 30 illustrate the formation of exemplary large-pitch conductive features 74, which may include metal lines and metal pads. The respective process is illustrated as process 324 in the process flow shown in FIG. 35. It is appreciated that additional metal lines and vias (not shown) may be formed between vias 64 and metal lines of conductive features 74, and the additional metal lines and vias may be formed using the PR-etching process, the HM-etching process, or the PR-assisted plating process, which may be determined based on whether the respective pitches are large pitches or fine pitches. Metal lines (which may include metal pads of conductive features 74) may include adhesion layer 74A and metal regions 74B. Metal lines and pads of conductive features 74 may have pitches greater than the threshold pitch, and hence are formed using the PR-assisted plating process.

Referring to FIG. 29, dielectric layer 76 is formed, followed by the formation of bond pads (or referred to as under-bump metallurgies) 78, as shown in FIG. 30. The respective process is illustrated as process 326 in the process flow shown in FIG. 35. Dielectric layer 76 may be formed using a material and a method selected from the candidate materials and the candidate methods for forming dielectric layer 56. Bond pads 78 may be formed of nickel, copper, titanium, or multi-layers thereof. In accordance with some exemplary embodiments, bond pads 78 include a titanium layer and a copper layer over the titanium layer.

Figure 31:
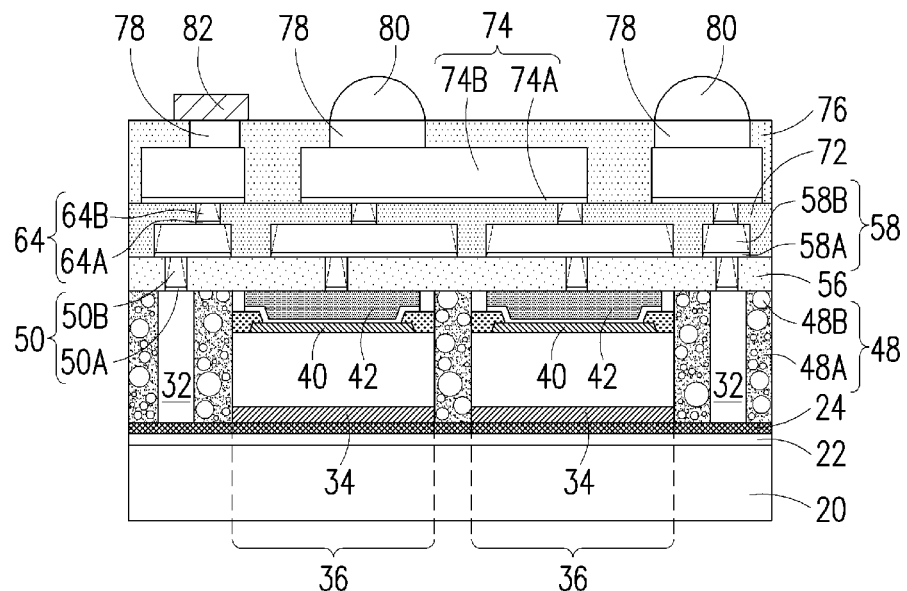

Referring to FIG. 31, electrical connectors 80, which may include a solder region, are also formed. Electrical connectors 80 are also referred to as solder regions 80. Throughout the description, the portions of the structure overlying release film 22 is referred to package 84, which may also be a composite wafer (or a reconstructed wafer) that includes a plurality of identical packages as illustrated. Surface-Mount Devices (SMDs) 82 may be bonded to the top surfaces of composite wafer 84.

Next, composite wafer 84 is placed on a tape (not shown), so that composite wafer 84 may be demounted from carrier 20, for example, by projecting a light on release film 22, and the light (such a laser beam) penetrates through the transparent carrier 20. The release film 22 is thus decomposed, and composite wafer 84 is released from carrier 20.

Figure 32:
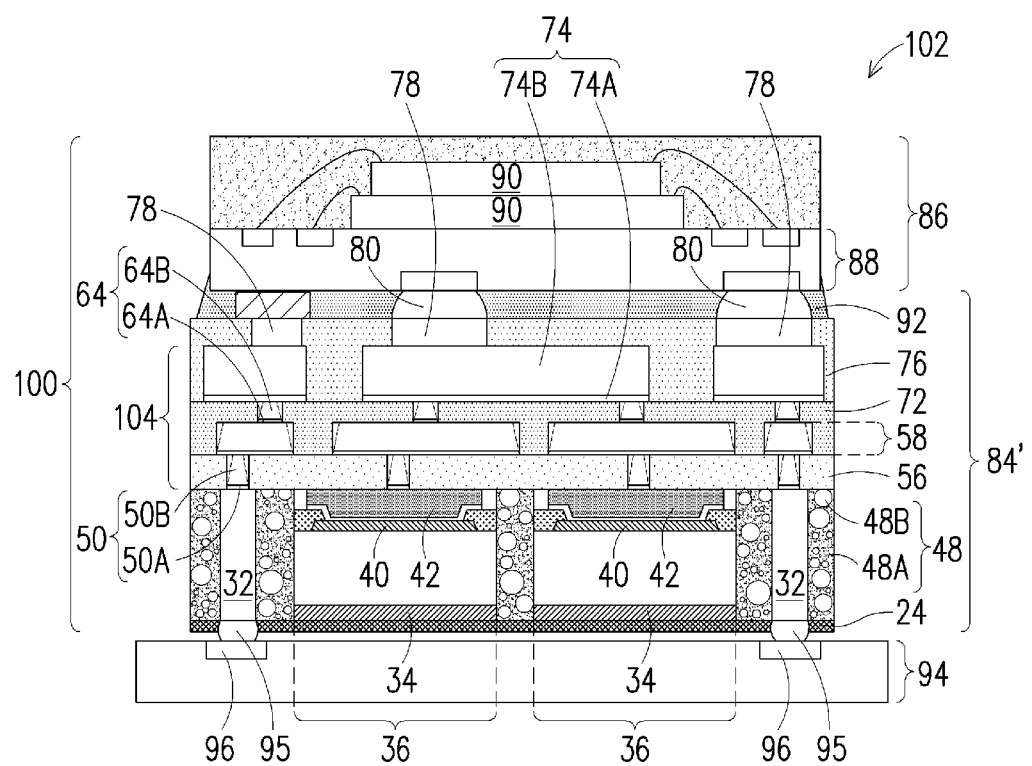

Referring to FIG. 32, openings (occupied by solder regions 95) are formed in dielectric buffer layer 24, and hence through-vias 32 are exposed. In accordance with some embodiments of the present disclosure, the openings are formed through laser drill. In accordance with alternative embodiments of the present disclosure, the openings are formed through etching in a lithography process.

Composite wafer 84 includes a plurality of packages 84' (refer to FIG. 32), which are identical to each other, with each of packages 84' including a plurality of through-vias 32 and one or more device die 36. FIG. 32 illustrates the bonding of package 86 onto package 84', thus forming a Package-on-Package (PoP) structure/package 100. The bonding is performed through solder regions 80. In accordance with some embodiments of the present disclosure, package 86 includes package substrate 88 and device die(s) 90, which may be memory dies such as Static Random Access Memory (SRAM) dies, Dynamic Random Access Memory (DRAM) dies, or the like. Underfill 92 is also disposed into the gap between package 86 and the underlying package 84', and is cured.

A singulation (die-saw) process is performed to separate composite wafer 84 into individual packages, which are identical to each other. FIG. 32 also illustrates the bonding of the singulated package to package component 94 through solder regions 95. In accordance with some embodiments of the present disclosure, package component 94 is a package substrate, which may be a coreless substrate or a substrate having a core (such as a fiberglass-enforced core). In accordance with other embodiments of the present disclosure, package component 94 is a printed circuit board or a package. The package in FIG. 32 is referred to as package 102 hereinafter.

Figure 33:
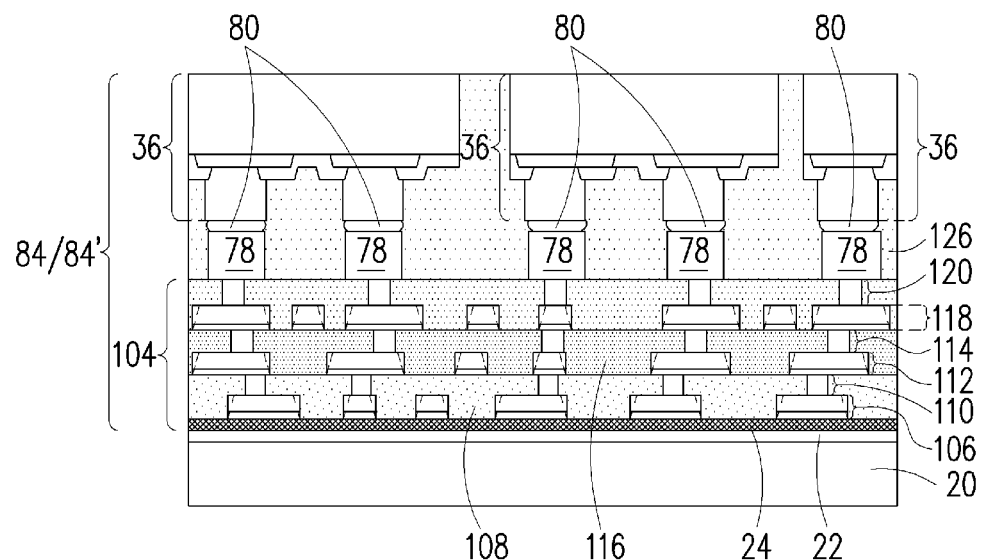
FIGS. 33 and 34 illustrate the cross-sectional views of intermediate stages in the formation of a package using RDL-first process in accordance with some embodiments.
Figure 34:
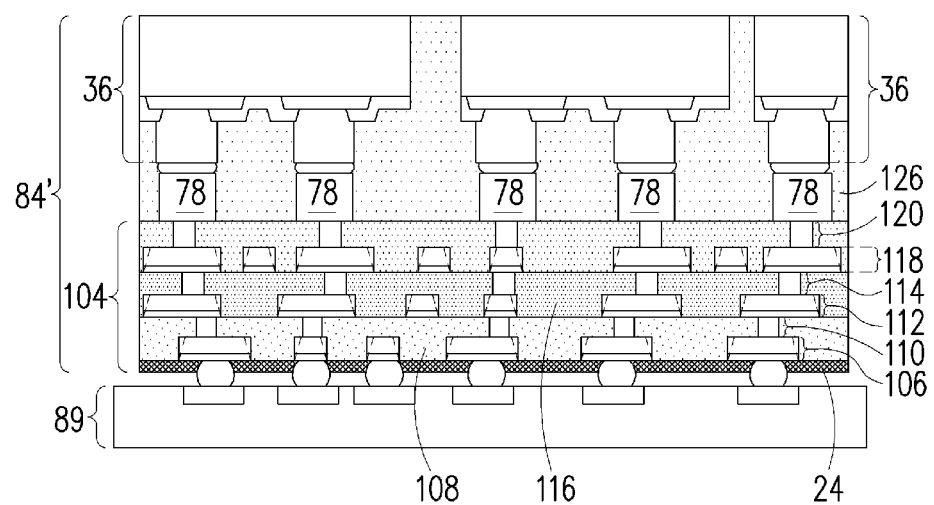

In FIG. 32, the RDLs including vias 50 and 64, metal lines 58, conductive features 74, and the corresponding dielectric layers are in combination referred to as redistribution structure 104. Package 84' is referred to as being formed using an RDL-last process since redistribution structure 104 is formed after the encapsulation of device dies 36. FIGS. 33 and 34 illustrate the formation of package 102 using an RDL-first process, in which redistribution structure 104 is formed before device dies 36 are bonded and encapsulated.

Referring to FIG. 33, carrier 20 is provided. Release film 22 and dielectric buffer layer 24 are formed over carrier 20. Next, redistribution structure 104 is formed over buffer layer 24. In accordance with some exemplary embodiments, redistribution structure 104 includes conductive features including metal lines 106, 112, and 118, and vias 110, 114, and 120, which are in dielectric layers 108, 116, and 122. Each layer of metal lines 106, 112, and 118 and vias 110, 114, and 120 may be formed using a method selected from the PR-etching process, the HM-etching process, and the PR-assisted plating process, and all combinations are contemplated. Also, whether to form a conductive feature layer using the PR-etching process, the HM-etching process, or the PR-assisted plating process may be determined based on the reliability of the PR (such as whether the respective minimum pitch is smaller than the threshold pitch or not), the process difficulty, the manufacturing cost, and the preference whether sidewalls are to be tilted. The formation process of redistribution structure 104 thus may be found referring to the formation of redistribution structure 104 in FIGS. 22 through 30 and the processes shown in FIGS. 1 through 12, and thus are not repeated.

FIG. 33 also illustrates the formation of bond pads (or UBMs or metal pillars) 78, solder regions 80, and the bonding of device dies 36 to bond pads 78. Encapsulating material 126, which may be a molding compound or a molding underfill, is dispensed. The demounting of carrier 20 (FIG. 33), the singulation, and the bonding of package component 89 to package 84' is illustrated in FIG. 34. Package component may be a package substrate, a printed circuit board, or the like.

In accordance with some embodiments of the present disclosure, in the formation of the packages 84' as shown in FIGS. 32 and 34, a first threshold pitch is determined for metal line layers. All conductive features (metal lines and pads) in the metal line layers having pitches equal to or greater than the first threshold pitch are formed using the PR-assisted plating process, and all conductive features in the metal line layers having pitches smaller than the first threshold pitch are formed using either the PR-etching process or the HM-etching process. A second threshold pitch is also determined for via layers. All vias in the via layers having pitches equal to or greater than the second threshold pitch are formed using the PR-assisted plating process, and all vias in the via layers having pitches smaller than the second threshold pitch are formed using either the PR-etching process or the HM-etching process. The first threshold pitch may be equal to or smaller than the second threshold pitch.

In above-illustrated exemplary embodiments, some exemplary processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming conductive features in the redistribution structure of packages using the PR-etching or HM-etching processes (both alternatively referred to as deposition-and-etching processes), the minimum pitch (without the reliability problem) of conductive features in the packages may be reduced. The PR-etching process and the HM-etching process may be combined with the PR-assisted plating process to achieve reduced pitch without causing unnecessary increase in manufacturing cost.

In accordance with some embodiments of the present disclosure, a method includes encapsulating a device die in an encapsulating material; planarizing the device die and the encapsulating material; and forming a first plurality of conductive features electrically coupling to the device die, wherein the forming the first plurality of conductive features comprises a deposition-and-etching process comprising: depositing a blanket copper-containing layer; forming a patterned photo resist over the blanket copper-containing layer; and etching the blanket copper-containing layer to transfer patterns of the patterned photo resist into the blanket copper-containing layer. In an embodiment, the first plurality of conductive features have tilted sidewalls having tilt angles smaller than about 85 degrees. In an embodiment, the forming the first plurality of conductive features further comprises depositing a hard mask over the blanket copper-containing layer; and etching the hard mask using the patterned photo resist as an etching mask, wherein the blanket copper-containing layer is etched using the hard mask as an etching mask. In an embodiment, the method further includes depositing an adhesion layer, with the adhesion layer and the hard mask being formed of a same material, wherein the blanket copper-containing layer is over and contacting the adhesion layer. In an embodiment, the method further includes forming a second plurality of conductive features electrically coupling to the first plurality of conductive features using a PR-assisted plating process, and the PR-assisted plating process comprises depositing a metal seed layer; forming an additional patterned photo resist over the metal seed layer; plating metal regions into openings in the additional patterned photo resist and over the metal seed layer; removing the additional patterned photo resist to expose portions of the metal seed layer; and etching the portions of the metal seed layer. In an embodiment, the first plurality of conductive features have a first minimum pitch smaller than a second minimum pitch of the second plurality of conductive features. In an embodiment, the method further includes forming a plurality of sample conductive features to determine a threshold pitch, wherein metal features in the plurality of sample conductive features having pitches smaller than the threshold pitch suffer from photo-resist-collapsing problem, and all metal features in the plurality of sample conductive features having pitches equal to or greater than the threshold pitch are free from the photo-resist-collapsing problem, wherein the first minimum pitch is smaller than the threshold pitch, and the second minimum pitch is equal to or greater than the threshold pitch. In an embodiment, the first plurality of conductive features comprise vias, and the second plurality of conductive features comprise metal lines, with top surfaces of the vias in physical contact with bottom surfaces of the metal lines. In an embodiment, the method further includes forming a plurality of conductive layers coupling to the device die, wherein the plurality of conductive layers comprise: a first plurality of conductive layers having minimum pitches smaller than a threshold pitch; and a second plurality of conductive layers having minimum pitches equal to or greater than the threshold pitch, wherein all of the first plurality of conductive layers are formed using an additional deposition-and-etch process, and all of the second plurality of conductive layers are formed using a PR-assisted plating process.

In accordance with some embodiments of the present disclosure, a method includes encapsulating a device die in an encapsulating material; and forming a plurality of conductive features electrically coupling to the device die comprising forming a first plurality of conductive features ha using PR-assisted plating processes; and forming a second plurality of conductive features using deposition-and-etching processes, wherein both the first plurality of conductive features and the second plurality of conductive features comprise copper, and a first smallest pitch of the first plurality of conductive features is greater than a second smallest pitch of the first plurality of conductive features. In an embodiment, the plurality of conductive features are formed before the encapsulating the device die. In an embodiment, the plurality of conductive features are formed after the encapsulating the device die.

In accordance with some embodiments of the present disclosure, a method includes forming a plurality of vias comprising: depositing a first adhesion layer; depositing a blanket copper-containing layer over the first adhesion layer; forming a first patterned photo resist over the blanket copper-containing layer; and etching the blanket copper-containing layer and the first adhesion layer; depositing a first dielectric layer to embed the plurality of vias; performing a first planarization on the first dielectric layer and the plurality of vias; forming a plurality of metal lines comprising: depositing a metal seed layer over and contacting the plurality of vias; depositing a second patterned photo resist over the metal seed layer; plating metal regions in the second patterned photo resist; removing the second patterned photo resist; and etching portions of the metal seed layer; depositing a second dielectric layer to embed the plurality of metal lines; and performing a second planarization on the second dielectric layer and the metal regions. In an embodiment, the forming the plurality of vias is performed by etching the blanket copper-containing layer using the first patterned photo resist as an etching mask. In an embodiment, the etching the blanket copper-containing layer adopts process conditions that form tilted sidewalls for the plurality of vias. In an embodiment, the tilted sidewalls have tilt angles between about 65 degrees and about 80 degrees. In an embodiment, the forming the vias further comprises: forming a hard mask over the blanket copper-containing layer, with the hard mask formed of a same material as the first adhesion layer, and the first patterned photo resist is over the hard mask; etching the hard mask using the first patterned photo resist as etching mask, wherein the etching the blanket copper-containing layer is performed using the etched hard mask as an etching mask. In an embodiment, the forming the metal seed layer comprises: depositing a second adhesion layer; and depositing a copper-containing seed layer over the second adhesion layer.

A structure comprising a device die a first plurality of conductive features over and electrically coupling to the device die, wherein the first plurality of conductive features have first sidewalls with first tilt angles smaller than 85 degrees; and a second plurality of conductive features over and electrically coupling to the first plurality of conductive features, wherein the second plurality of conductive features have second sidewalls with second tilt angles greater than 85 degrees and equal to or smaller than about 90 degrees. In an embodiment, the second plurality of conductive features has bottom surfaces in contact with top surfaces of the first plurality of conductive features. In an embodiment, the device die comprises electrical connectors, and wherein the first plurality of conductive features is vias in contact with electrical connectors of the device die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
encapsulating a device die in an encapsulating material; and
forming a first plurality of conductive features electrically coupling to the device die, wherein the forming the first plurality of conductive features comprises a deposition-and-etching process comprising:
depositing an adhesion layer;
depositing a blanket copper-containing layer over and contacting the adhesion layer;
depositing a hard mask over the blanket copper-containing layer, wherein the adhesion layer and the hard mask are formed of a same material;
forming a patterned photo resist over the hard mask;
etching the hard mask using the patterned photo resist as an etching mask; and
etching the blanket copper-containing layer using the etched hard mask as an additional etching mask to transfer patterns of the patterned photo resist into the blanket copper-containing layer.

2. The method of claim 1, wherein the first plurality of conductive features have tilted sidewalls having tilt angles smaller than about 85 degrees.

3. The method of claim 1, wherein the hard mask is etched in a wet etching process.

4. The method of claim 1, wherein the hard mask is etched in a dry etching process.

5. The method of claim 1 further comprising forming a second plurality of conductive features electrically coupling to the first plurality of conductive features using a PR-assisted plating process, and the PR-assisted plating process comprises:
depositing a metal seed layer;
forming an additional patterned photo resist over the metal seed layer;
plating metal regions into openings in the additional patterned photo resist and over the metal seed layer;
removing the additional patterned photo resist to expose portions of the metal seed layer; and
etching the portions of the metal seed layer.

6. The method of claim 5, wherein the first plurality of conductive features have a first minimum pitch smaller than a second minimum pitch of the second plurality of conductive features.

7. The method of claim 6 further comprising:
forming a plurality of sample conductive features to determine a threshold pitch, wherein metal features in the plurality of sample conductive features having pitches smaller than the threshold pitch suffer from photo-resist-collapsing problem, and all metal features in the plurality of sample conductive features having pitches equal to or greater than the threshold pitch are free from the photo-resist-collapsing problem, wherein the first minimum pitch is smaller than the threshold pitch, and the second minimum pitch is equal to or greater than the threshold pitch.

8. The method of claim 5, wherein the first plurality of conductive features comprise vias, and the second plurality of conductive features comprise metal lines, with top surfaces of the vias in physical contact with bottom surfaces of the metal lines.

9. The method of claim 1 comprising forming a plurality of conductive layers coupling to the device die, wherein the plurality of conductive layers comprise:
a first plurality of conductive layers having minimum pitches smaller than a threshold pitch; and
a second plurality of conductive layers having minimum pitches equal to or greater than the threshold pitch, wherein all of the first plurality of conductive layers are formed using an additional deposition-and-etch process, and all of the second plurality of conductive layers are formed using a PR-assisted plating process.

10. The method of claim 1, wherein the adhesion layer and the hard mask are formed of titanium.

11. The method of claim 1, wherein the adhesion layer and the hard mask are formed of titanium nitride.

12. A method comprising:
forming a plurality of vias comprising:
depositing a first adhesion layer;
depositing a blanket copper-containing layer over the first adhesion layer;
forming a hard mask over the blanket copper-containing layer, with the hard mask formed of a same material as the first adhesion layer;
forming a first patterned photo resist over the hard mask;
etching the hard mask using the first patterned photo resist as an etching mask;
etching the blanket copper-containing layer and the first adhesion layer, wherein the blanket copper-containing layer is etched using the etched hard mask as an additional etching mask;
depositing a first dielectric layer to embed the plurality of vias;
performing a first planarization on the first dielectric layer and the plurality of vias;
forming a plurality of metal lines comprising:
depositing a metal seed layer over and contacting the plurality of vias;
depositing a second patterned photo resist over the metal seed layer;
plating metal regions in the second patterned photo resist;
removing the second patterned photo resist; and
etching portions of the metal seed layer;
depositing a second dielectric layer to embed the plurality of metal lines; and
performing a second planarization on the second dielectric layer and the metal regions.

13. The method of claim 12, further comprising removing the patterned photo resist before the blanket copper-containing layer is etched.

14. The method of claim 13, wherein the etching the blanket copper-containing layer adopts process conditions that form tilted sidewalls for the plurality of vias.

15. The method of claim 12, wherein the tilted sidewalls have tilt angles between about 65 degrees and about 80 degrees.

16. The method of claim 12, wherein the forming the metal seed layer comprises:
depositing a second adhesion layer; and
depositing a copper-containing seed layer over the second adhesion layer.

17. The method of claim 12, wherein the hard mask is formed of titanium.

18. A method comprising:
forming a first plurality of conductive features over and electrically coupling to a device die, wherein the first plurality of conductive features have first sidewalls with first tilt angles smaller than 85 degrees; and
after the first plurality of conductive features are formed, forming a second plurality of conductive features over and electrically coupling to the first plurality of conductive features, wherein the second plurality of conductive features have second sidewalls with second tilt angles greater than 85 degrees and equal to or smaller than about 90 degrees.

19. The method of claim 18, wherein the forming the first plurality of conductive features comprises etching a blanket conductive layer, and the forming the second plurality of conductive features comprises plating.

20. The method of claim 18, wherein the first plurality of conductive features have pitches smaller than additional pitches of the second plurality of conductive features.

* * * * *